United States Patent
Humfeld

(10) Patent No.: US 10,619,246 B2
(45) Date of Patent: Apr. 14, 2020

(54) INTERWOVEN CARBON NANOTUBE MATS

(71) Applicant: The Boeing Company, Chicago, IL (US)

(72) Inventor: Keith Daniel Humfeld, Federal Way, WA (US)

(73) Assignee: The Boeing Company, Chicago, IL (US)

(*) Notice: Subject to any disclaimer, the term of this patent is extended or adjusted under 35 U.S.C. 154(b) by 476 days.

(21) Appl. No.: 15/086,458

(22) Filed: Mar. 31, 2016

(65) Prior Publication Data
US 2017/0283262 A1  Oct. 5, 2017

(51) Int. Cl.
| | | |
|---|---|---|
| *B32B 9/00* | (2006.01) | |
| *C23C 16/52* | (2006.01) | |
| *C23C 16/26* | (2006.01) | |
| *C23C 16/46* | (2006.01) | |
| *C01B 32/16* | (2017.01) | |
| *C23C 16/48* | (2006.01) | |
| *C23C 16/44* | (2006.01) | |
| *B82Y 40/00* | (2011.01) | |
| *B82Y 30/00* | (2011.01) | |

(52) U.S. Cl.
CPC .............. *C23C 16/52* (2013.01); *C01B 32/16* (2017.08); *C23C 16/26* (2013.01); *C23C 16/4418* (2013.01); *C23C 16/46* (2013.01); *C23C 16/482* (2013.01); *B82Y 30/00* (2013.01); *B82Y 40/00* (2013.01); *Y10S 977/742* (2013.01); *Y10S 977/843* (2013.01)

(58) Field of Classification Search
CPC .............. C23C 16/00; C23C 16/26; C01B 31/022–0293; B82Y 30/00; Y10T 428/30
USPC ......... 428/408; 423/448, 447.1; 252/500–501
See application file for complete search history.

(56) References Cited

U.S. PATENT DOCUMENTS

| | | | | |
|---|---|---|---|---|
| 2005/0095938 A1* | 5/2005 | Rosenberger | .......... | A41D 31/00 442/194 |
| 2007/0117488 A1* | 5/2007 | Yokoh | .................... | B82Y 30/00 442/301 |
| 2008/0069760 A1* | 3/2008 | O'Brien | ................. | B01J 23/882 423/447.3 |
| 2011/0070370 A1* | 3/2011 | Teo | ........................ | C23C 16/452 427/255.28 |

(Continued)

FOREIGN PATENT DOCUMENTS

| | | |
|---|---|---|
| WO | 2006135375 A3 | 4/2009 |
| WO | 2010059325 A1 | 5/2010 |

OTHER PUBLICATIONS

Joseph F. Aubuchon et al; Multiple Sharp Bendings of Carbon Nanotubes during Growth to Produce Zigzag Morphology;Jul. 7, 2004.

(Continued)

*Primary Examiner* — Daniel H Miller
(74) *Attorney, Agent, or Firm* — Duft & Bornsen, PC

(57) ABSTRACT

Systems and methods are provided for interweaving carbon nanotubes. One embodiment comprises a layer of carbon nanotubes. The layer includes carbon nanotubes oriented in a first direction, as well as carbon nanotubes oriented in a second direction that crosses the first direction. The carbon nanotubes oriented in the second direction are interwoven through the carbon nanotubes oriented in the first direction.

25 Claims, 16 Drawing Sheets

(56) References Cited

U.S. PATENT DOCUMENTS

2011/0253907 A1* 10/2011 Qian .................. H01J 37/20
                                                    250/491.1
2011/0291315 A1* 12/2011 Roberts ............... D04H 1/4382
                                                    264/108

OTHER PUBLICATIONS

Joseph F. Aubuchon; Control of Carbon Nanotube Growth Directions via Electric Fields within a DC Plasma Sheath; vol. 1 No. 1 2005.

Kang Chiwon et al; Three-dimensional carbon nanotubes for high capacity lithium-ion batteries; Sep. 18, 2015.

Limin Huang et al; Orientated assembly of single-walled carbon nanotubes and applications; Journal of Materials Chemistry; Jan. 1, 2007.

European Search Report; Appl 17161206.2-1375; dated Aug. 31, 2017.

Aubuchon et al., Electric-Field-Guided Growth of Carbon Nanotubes during DC Plasma-Enhanced CVD, Chemical Vapor Deposition, DOI: 10.1002/cvde.200506444, Wiley-VCH Verlag GmbH & Co. KGaA, Weinheim, 2006.

DAMBROT, of catalysts and chirality: Highly-selective growth of structure-specific single-walled carbon nanotubes, http://phys.org/news/2014-07-catalysts-chirality-highly-selective-growth-structure-specific_single-walled-carbon-nanotubes, Feb. 1, 2016.

Optical properties of carbon nanotubes, Wikipedia, https://en.wikipedia.org/wiki/Optical_properties_of_carbon_nanotubes, Feb. 16, 2016.

Spinning continuous carbon nanotubes yarns, Nature, vol. 419, www.nature.com/nature, EBSCO Publishing, Oct. 24, 2002.

Super-tough carbon-nanotubes fibres, Nature, vol. 423, www.nature.com/nature, EBSCO Publishing, Jun. 12, 2003.

Tsukruk et al., Nanotube Surface Arrays: Weaving, Bending, and Assembling on Patterned Silicon, Physical Review Letters, vol. 92, No. 6, The American Physical Society, Feb. 13, 2004.

U.S. Appl. No. 14/611,734.

Wang et al., High-Performance Two-Ply Yarn Supercapcitors Based on Carbon Nanotubes and Polyaniline Nanowire Arrays, Advanced Materials, www.advmat.de, wileyonlinelibrary.com, Wiley-VCH Verlag GmbH & Co KGaA, Weinheim, 2013.

Zhang et al., Growth of Half-Meter Long Carbon Nanotubes Based on Schulz-Flory Distribution, American Chemical Society, vol. 7, No. 7, Jun. 27, 2013.

European Office Action; Application 171612062; dated Dec. 21, 2018.

* cited by examiner

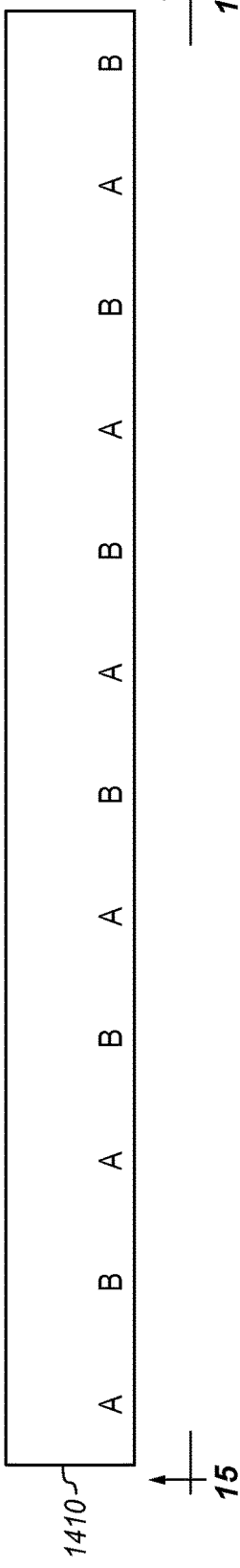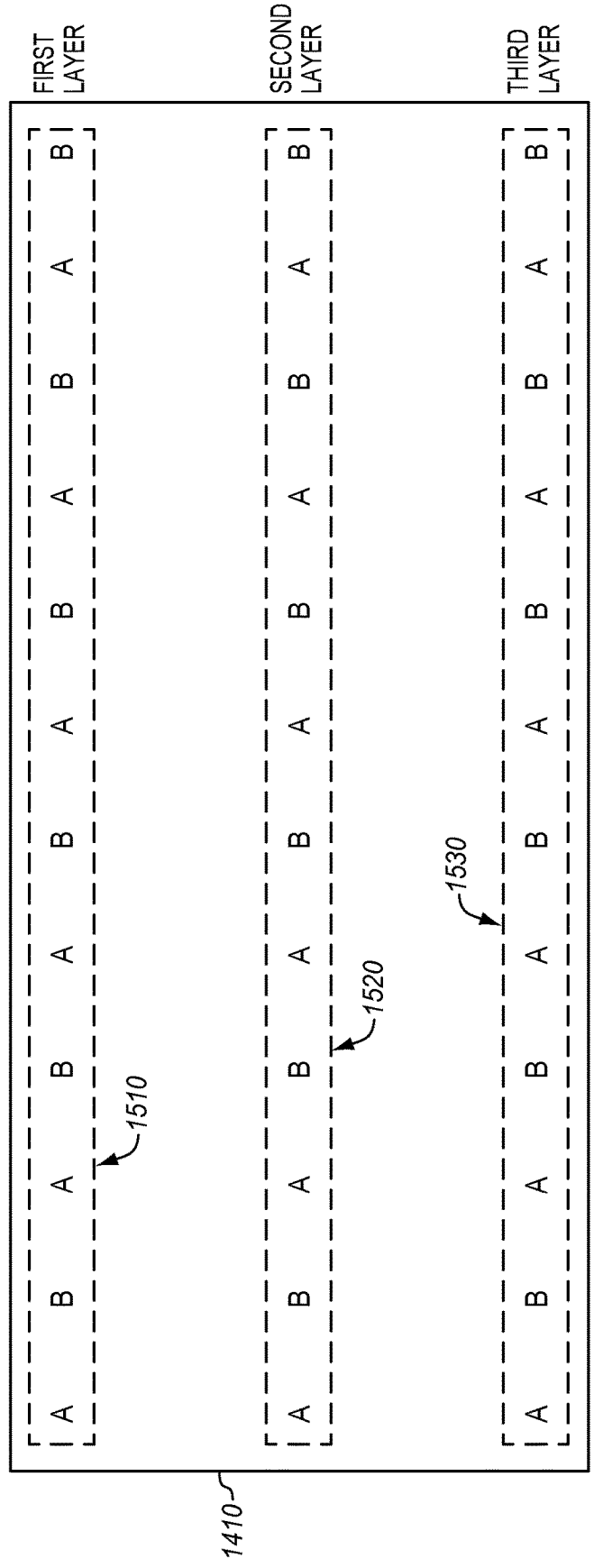

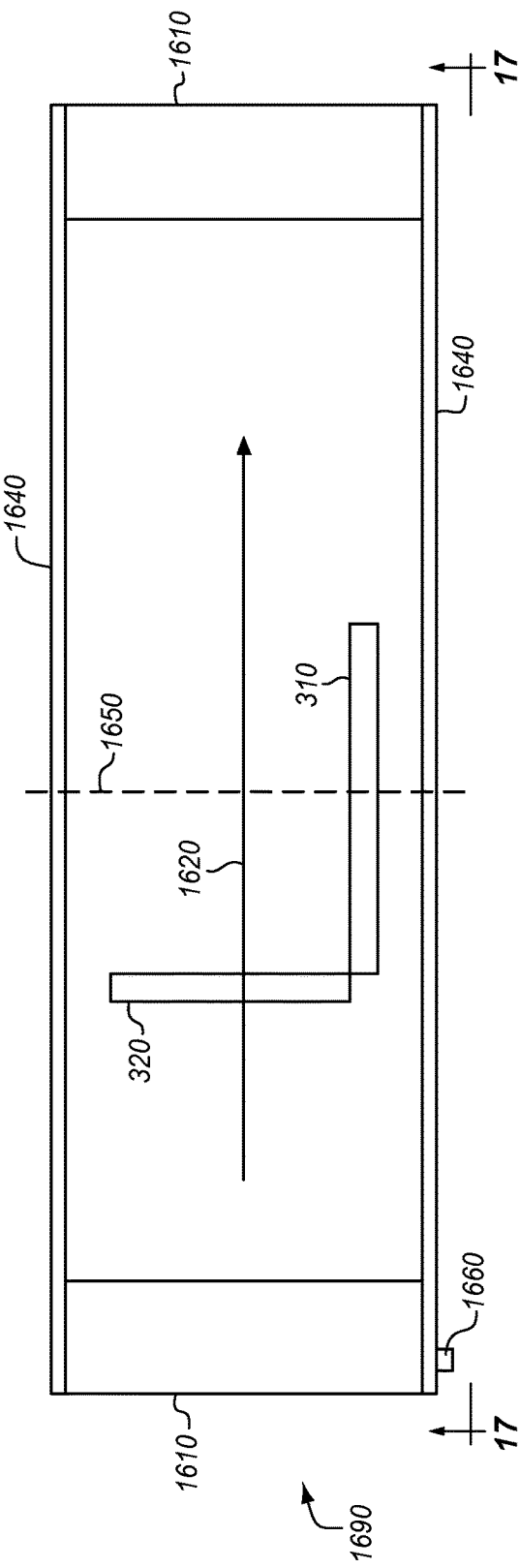

INTERWOVEN CARBON NANOTUBE MATS

FIELD

The disclosure relates to the field of materials science, and in particular, to carbon nanotubes.

BACKGROUND

Carbon nanotubes are resilient materials that are noted for their incredible strength and flexibility. However, carbon nanotubes are small (e.g., having a width on the order of nanometers), which makes it hard to harness their properties in products that are implemented on larger scales such as the meter scale. For example, carbon nanotubes may be bundled into large sheets/mats that use a binder to hold the nanotubes together. The strength of these mats is dependent upon the strength of the binder holding the nanotubes together.

Since carbon nanotubes continue to exhibit extraordinary strength and other desirable properties, it remains desirable to develop materials that are capable of exhibiting a similar strength on the macroscopic level.

SUMMARY

Embodiments described herein include sheets of carbon nanotubes that are woven together during fabrication. Because nanotubes traveling in different directions are interweaved into a unified layer, the nanotubes themselves are placed into shear and/or tension when forces are applied to the layer. Hence, the mode of failure for the layer does not result from the failure of a binding agent, but rather requires that the nanotubes themselves break. This makes the layer orders of magnitude stronger than prior materials utilizing carbon nanotubes, which is highly desirable.

One embodiment is a method for selectively growing carbon nanotubes via a Chemical Vapor Deposition (CVD) process. The method includes aligning an electrical field in a first direction for a first set of carbon nanotubes, heating the first set of carbon nanotubes above a threshold temperature to trigger parallel growth of the first set of carbon nanotubes in the first direction via CVD, and repeatedly varying the first direction by adjusting the electrical field, causing the first set of carbon nanotubes to interweave into a second set of carbon nanotubes as growth continues.

A further embodiment is a system for fabricating a sheet of interwoven carbon nanotubes. The system includes carbon nanotube catalysts that grow different sets of nanotubes, a heating system configured to emit light to heat the nanotubes, an electric field generator, and a controller. The controller is configured to operate the heating system to selectively heat individual sets in order to trigger carbon nanotube growth during Chemical Vapor Deposition (CVD), and to operate the electric field generator to generate an electrical field that points in a direction that varies during the growth of a set of carbon nanotubes, causing carbon nanotubes of the set to interweave other carbon nanotubes as growth continues.

A further embodiment is a system for fabricating a sheet of interwoven carbon nanotubes. The system includes carbon nanotube catalysts that grow different chiralities of nanotubes, a lighting system, and an electric field generator. The system also includes a controller that is able to operate the lighting system to selectively heat individual chiralities in order to trigger carbon nanotube growth during Chemical Vapor Deposition (CVD), and to operate the electric field generator to generate an electrical field that points in a direction that varies during the growth of a chirality of carbon nanotubes, causing carbon nanotubes of the chirality to interweave other carbon nanotubes as growth continues.

Another embodiment is a further system for fabricating a sheet of interwoven carbon nanotubes. The system includes a first substrate comprising carbon nanotube catalysts arranged on top of integrated heaters, and a second substrate oriented at a non-zero angle with respect to the first substrate. The second substrate includes carbon nanotube catalysts arranged on top of integrated heaters. The system further includes an electrical field generator. The system also includes a controller that is able to operate the integrated heaters to selectively heat a set of carbon nanotubes in order to catalyze growth during Chemical Vapor Deposition (CVD), and to operate the electric field generator to generate an electrical field that varies in direction during growth of the set of carbon nanotubes, causing the set of carbon nanotubes to interweave other carbon nanotubes as growth continues.

Another embodiment is a material. The material includes a layer of carbon nanotubes. The layer includes carbon nanotubes oriented in a first direction. The layer also includes carbon nanotubes oriented in a second direction that crosses the first direction, and that are interwoven through the carbon nanotubes oriented in the first direction.

Another embodiment is a further material. The material includes a first set of carbon nanotubes that comprise a first chirality and that are oriented in parallel, a second set of carbon nanotubes that comprise a second chirality and that form a first sinusoid intersecting the first set, and a third set of carbon nanotubes that comprise a third chirality and that form a second sinusoid intersecting the first set. The second sinusoid is shifted in phase from the first sinusoid.

Other exemplary embodiments (e.g., methods and computer-readable media relating to the foregoing embodiments) may be described below. The features, functions, and advantages that have been discussed can be achieved independently in various embodiments or may be combined in yet other embodiments further details of which can be seen with reference to the following description and drawings.

DESCRIPTION OF THE DRAWINGS

Some embodiments of the present disclosure are now described, by way of example only, and with reference to the accompanying drawings. The same reference number represents the same element or the same type of element on all drawings.

FIGS. 14-15 are diagrams illustrating a substrate capable of growing multiple layers of carbon nanotubes at once in an exemplary embodiment.

FIGS. 16-17 are diagrams illustrating motion of an electric field generator about substrates for growing carbon nanotubes in an exemplary embodiment.

DESCRIPTION

The figures and the following description illustrate specific exemplary embodiments of the disclosure. It will thus be appreciated that those skilled in the art will be able to devise various arrangements that, although not explicitly described or shown herein, embody the principles of the disclosure and are included within the scope of the disclosure. Furthermore, any examples described herein are intended to aid in understanding the principles of the disclosure, and are to be construed as being without limitation to such specifically recited examples and conditions. As a result, the disclosure is not limited to the specific embodiments or examples described below, but by the claims and their equivalents.

Figure 1:
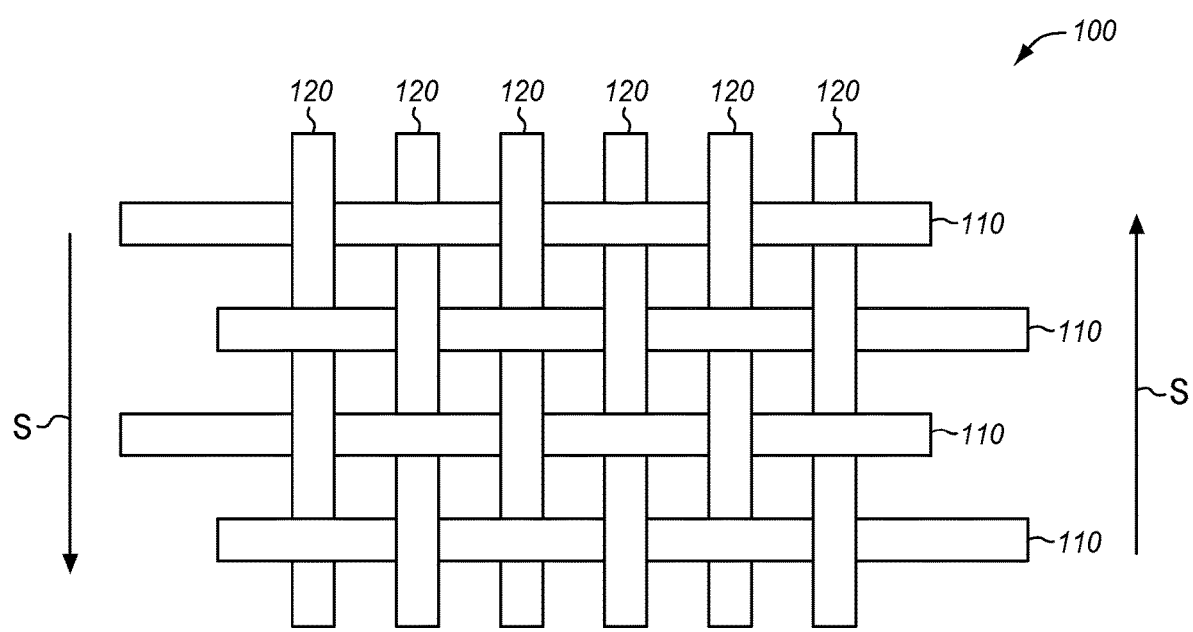
FIG. 1 is a diagram illustrating an interweaved layer of carbon nanotubes in an exemplary embodiment.

FIG. 1 is a diagram illustrating an interweaved layer 100 of carbon nanotubes in an exemplary embodiment. In FIG. 1, nanotubes 110 running horizontally are interweaved with nanotubes 120 running vertically. When shear forces (S) are applied to layer 100, those shear forces are borne by nanotubes 110. This causes layer 100 to exhibit a high strength. That is, the strength of layer 100 results from the strength of the nanotubes that it is made from, in that the high strength is due to load being directly borne by the carbon nanotubes rather than a binder material. If the woven structure of layer 100 was not used, it would not be as strong. The following description and figures illustrate systems and methods for creating such interweaved layers of carbon nanotubes.

Figure 2:
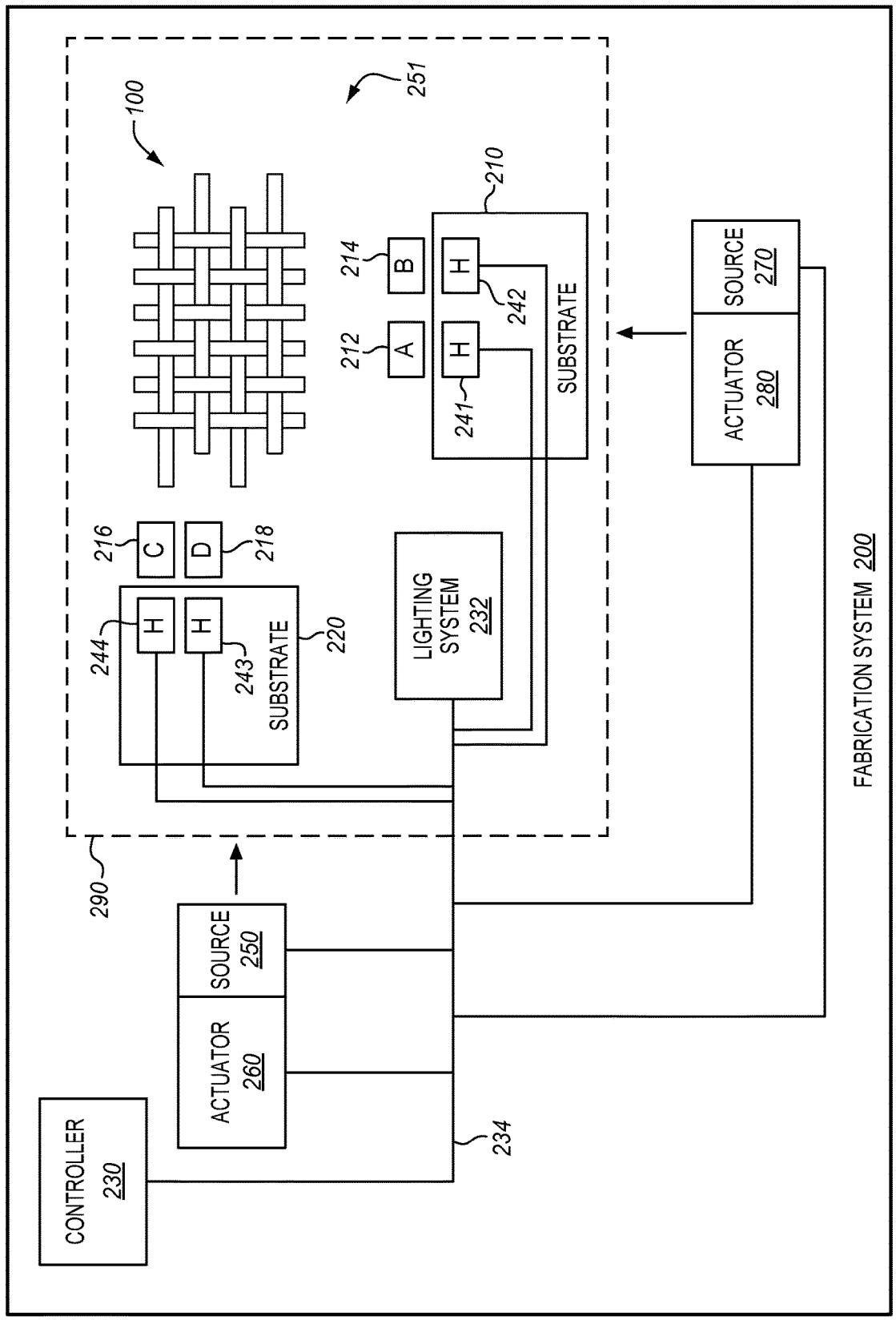
FIG. 2 is a block diagram illustrating a fabrication system for carbon nanotubes in an exemplary embodiment.

FIG. 2 is a block diagram illustrating a fabrication system 200 for creating woven sheets of carbon nanotubes in an exemplary embodiment. Fabrication system 200 comprises any system capable of weaving carbon nanotubes together as those nanotubes are grown via Chemical Vapor Deposition (CVD) processes. In this embodiment, fabrication system 200 includes CVD chamber 290, in which multiple substrates (210, 220) are placed. Substrate 210 includes catalysts 212 and 214, and substrate 220 includes catalysts 216 and 218. The catalysts (212, 214, 216, 218) facilitate carbon nanotube growth via CVD processes. In this embodiment, each catalyst corresponds with a different chirality of carbon nanotube. Thus, catalyst 212 grows chirality A, catalyst 214 grows chirality B, catalyst 216 grows chirality C, and catalyst 218 grows chirality D. As used herein, different "chiralities" of carbon nanotubes are carbon nanotubes that have distinct pairs of chiral numbers m and n, denoted as (n,m). These variables n and m characterize a nanotube by serving as unit vectors along different directions in a crystal lattice formed by a carbon nanotube. During fabrication, there may be many catalysts of each chirality, and catalysts of different chiralities may alternate with respect to each other when placed on the same substrate.

Fabrication system 200 also includes systems that selectively trigger and direct growth from each of the catalysts (212, 214, 216, 218). That is, controller 230 may operate heating elements 241-244 in order to selectively heat individual catalysts to a threshold temperature that triggers CVD processes. Alternatively or additionally, controller 230 may operate lighting system 232 to apply light at wavelengths that energize and heat certain chiralities (e.g., A) without increasing the temperature of other chiralities (e.g., B, C, D) above a threshold temperature. Controller 230 may be implemented, for example, as custom circuitry, as a processor executing programmed instructions, or some combination thereof.

As controller 230 selectively triggers the growth of individual catalysts (or sets of catalysts), controller 230 may operate one or more electric field sources (250, 270) in order to generate electrical fields. As carbon nanotube growth occurs within interior 251 of CVD chamber 290 to form layer 100, the carbon nanotubes will grow parallel to the applied electrical fields. Controller 230 may further operate actuators (e.g., 260, 280) in order change the direction of the electrical fields as growth continues (e.g., simultaneously with the growth of the carbon nanotubes, or in between growth phases before the carbon nanotubes have finished growing to their intended length). This may ensure that different chiralities and/or sets of nanotubes grow in different directions.

By selectively growing different sets of nanotubes, and by controlling the direction of growth of each set of nanotubes via electric field sources 250 and 270, controller 230 may interweave different carbon nanotubes together in any suitable pattern (e.g., a plain weave, a twill weave, a satin weave, etc.). This provides a substantial benefit by enhancing the strength of layers of materials that utilize carbon nanotubes.

Illustrative details of the operation of fabrication system 200 will be discussed with regard to FIG. 3. Assume, for this embodiment, that catalysts A and B are arranged in an alternating/interspersed pattern on substrate 210 and that catalysts C and D are arranged in an alternating pattern on substrate 220 (e.g., as shown in FIG. 4). The catalysts arranged on substrates 210 and 220 are substantially coplanar, and substrates 210 and 220 are separated by an angle θ (e.g., ninety degrees).

Figure 3:
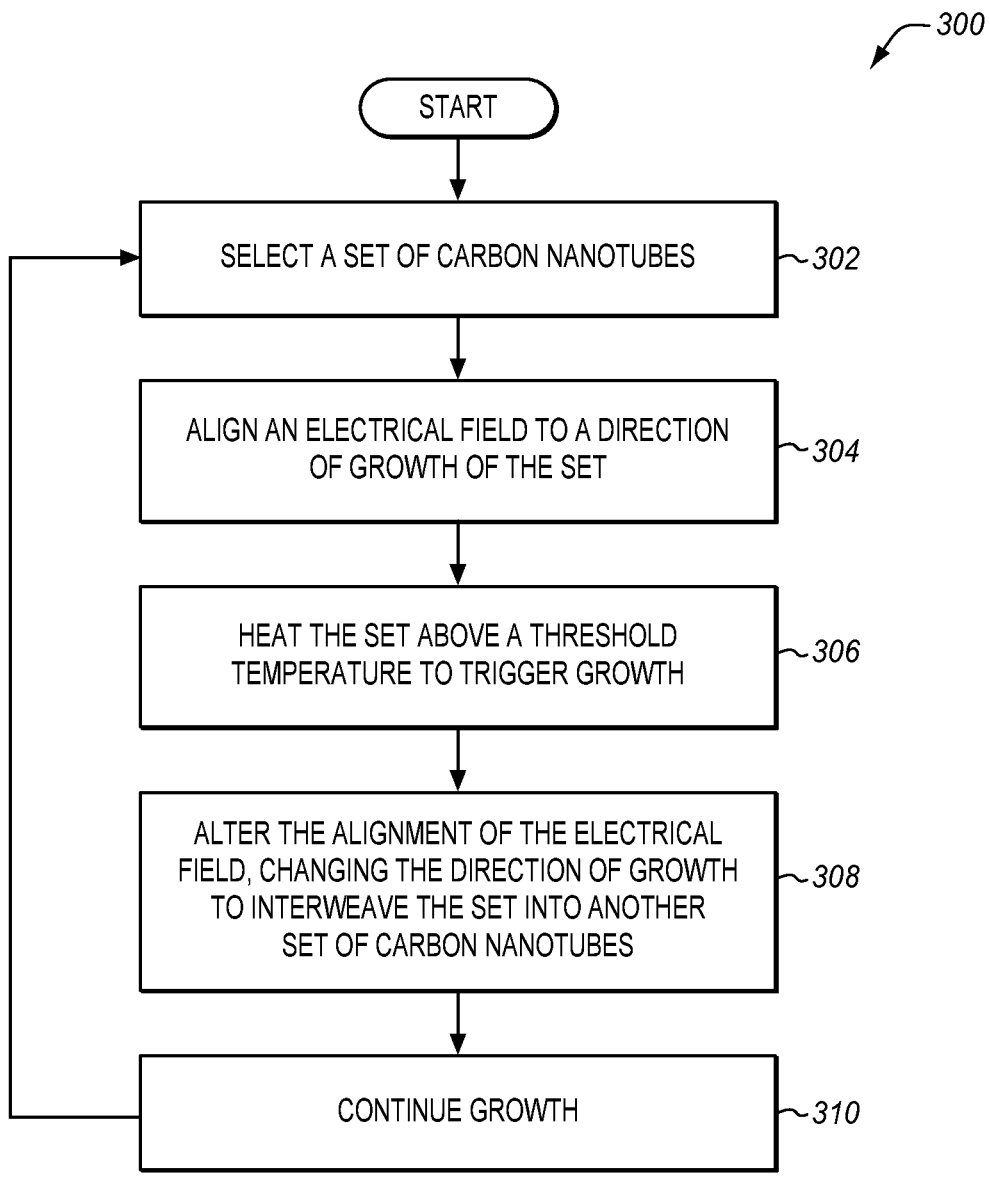
FIG. 3 is a flowchart illustrating a method for growing carbon nanotubes into an interweaved layer in an exemplary embodiment.
Figure 4:
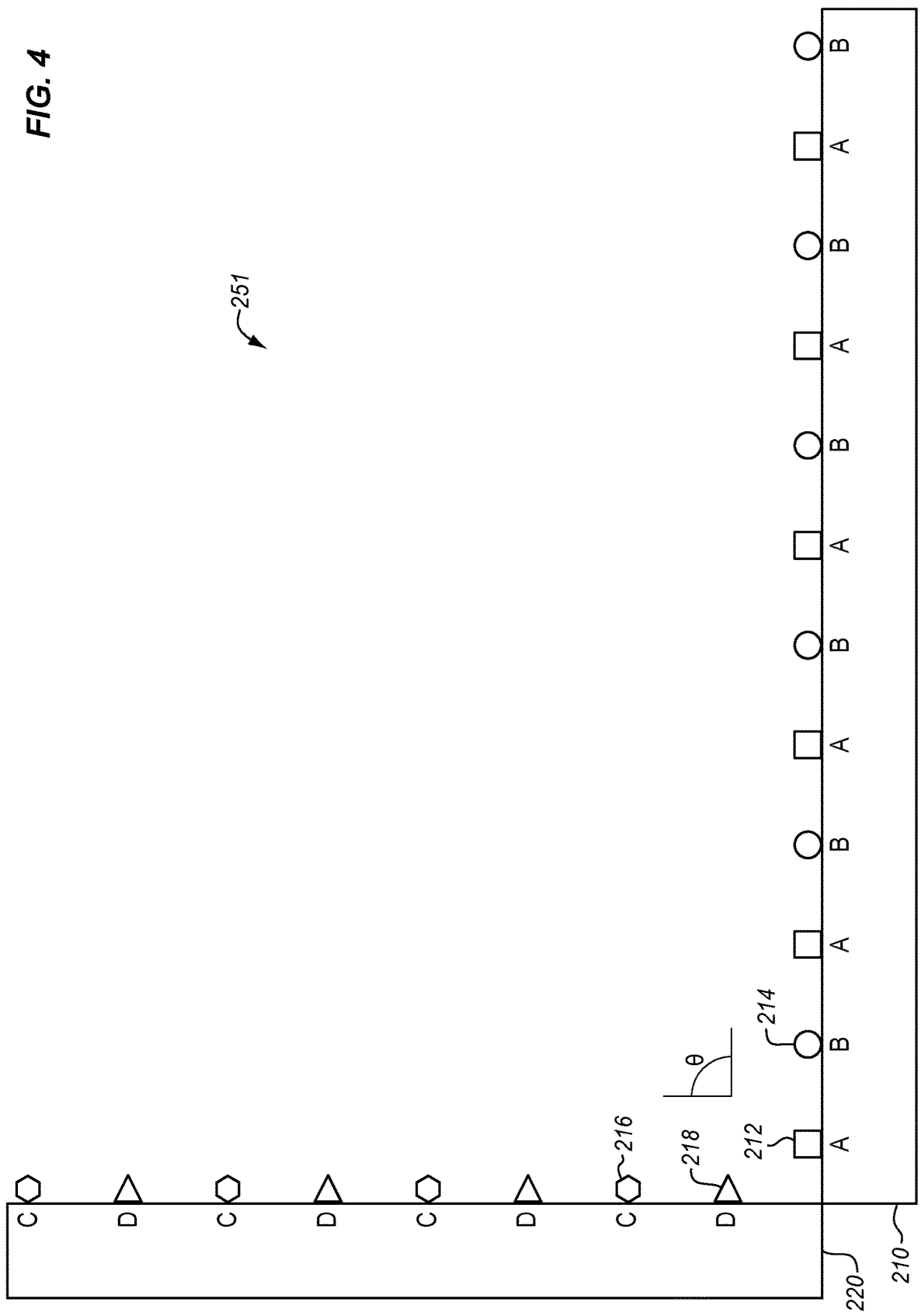
FIGS. 4-10 illustrate growth of an interweaved layer of carbon nanotubes in an exemplary embodiment.

FIG. 3 is a flowchart illustrating a method 300 for growing carbon nanotubes into an interweaved layer in an exemplary embodiment. The steps of method 300 are described with reference to fabrication system 200 of FIG. 2, but those skilled in the art will appreciate that method 300 may be performed in other systems. The steps of the flowcharts described herein are not all inclusive and may include other steps not shown. The steps described herein may also be performed in an alternative order.

Figure 5:
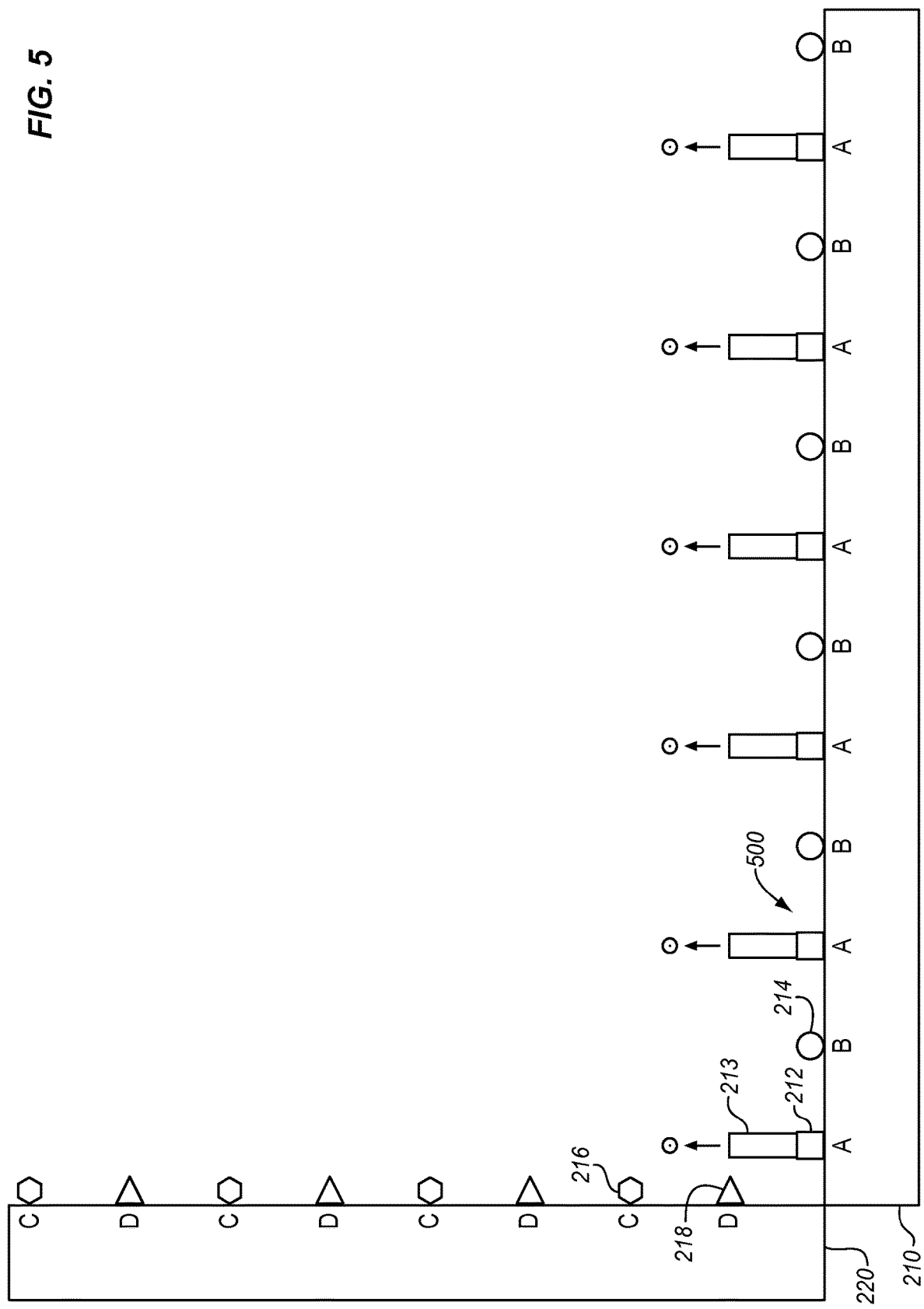

In order to initiate the process, controller 230 selects a set of carbon nanotubes to grow (step 302). In this case, nanotubes 213 having chirality A (which grow from catalysts 212) are chosen for growth, as shown in FIG. 5. As shown in FIG. 5 and following figures, the size of individual carbon nanotubes has been substantially exaggerated in order to clarify in the weaving processes described herein.

Controller 230 directs one or more actuators (e.g., 280, 260) and/or electric field sources (e.g., 250, 270) to align an electrical field in a desired direction of growth for the selected set of carbon nanotubes (step 304). In this case, the nanotubes will be grown upward along the page, and into the page as shown by the vectors illustrated in FIG. 5. Hence, controller 230 instructs actuators (e.g., 280, 260) and/or electric field sources/generators (e.g., 250, 270) to align an electrical field in the desired direction.

With the electrical field aligned properly, nanotubes growing from catalysts 212 will grow in the expected direction. Thus, controller 230 directs elements of fabrication system 200 (e.g., heaters 241-244, or lighting system 232) to heat catalysts 212 above a threshold temperature in order to trigger parallel nanotube growth in the desired direction via CVD processes (step 306). It should be noted that in embodiments which utilize a lighting system to apply heat, the lighting system heats carbon nanotubes, which transfer heat to their corresponding catalysts via conduction. Thus, as an initial step, it may be desirable to place substrates 210 and 220 into a heated oven to trigger a small amount of uniform growth at each of the catalysts, before utilizing the lighting system to heat individual chiralities. This ensures that there are carbon nanotubes for the lighting system to heat in step 306.

As used herein, the threshold temperature is a temperature at which growth continues at a non-negligible rate. While CVD processes may cause growth to occur for all carbon nanotubes at lower temperatures, the speed of this growth is orders of magnitude slower below a threshold temperature, and therefore not acceptable for fabrication purposes. For example, the threshold temperature may be selected to trigger growth in the range of several tens of microns per minute (e.g., a temperature of 650° C., 700° C., etc.). In one embodiment, the nanotubes are all kept at a temperature just below the threshold temperature (e.g., 20° C. below the threshold temperature), and then individual sets of nanotubes are heated above the threshold temperature to trigger growth at viable rates. Heating the first set of carbon nanotubes as shown in FIG. 5 causes the carbon nanotubes 213 to grow upward and out of the page towards the reader. At each carbon nanotube 213, carbon atoms are drawn out of the surrounding environment proximate to catalyst 212 at location 500. These carbon atoms are added to the carbon nanotubes 213, increasing their length in the direction of the electric field.

As growth continues (e.g., before the carbon nanotubes have completed growing to their intended length, or during a period of time at which the carbon nanotubes are over the threshold temperature and actively growing), controller 230 changes the direction by altering the alignment of the electrical field (step 308). This changes the direction of growth for the carbon nanotubes, which causes the carbon nanotubes to interweave with another set of carbon nanotubes. As the direction of the electric field changes, the direction in which the carbon nanotubes grow also changes. In this manner, by oscillating the direction of the electric field as carbon nanotubes grow, the carbon nanotubes may form sinusoids along their length.

Figure 6:
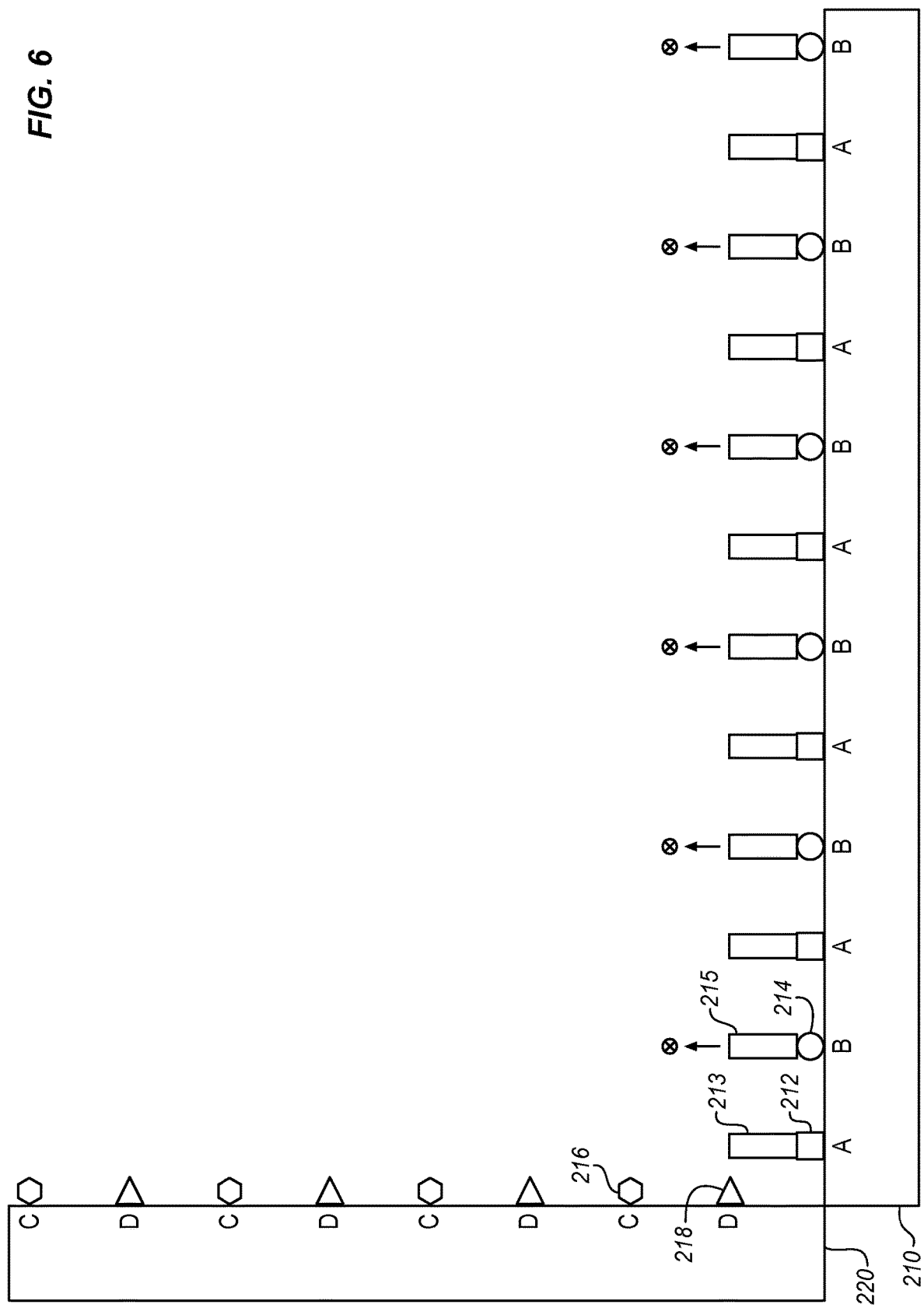
Figure 7:
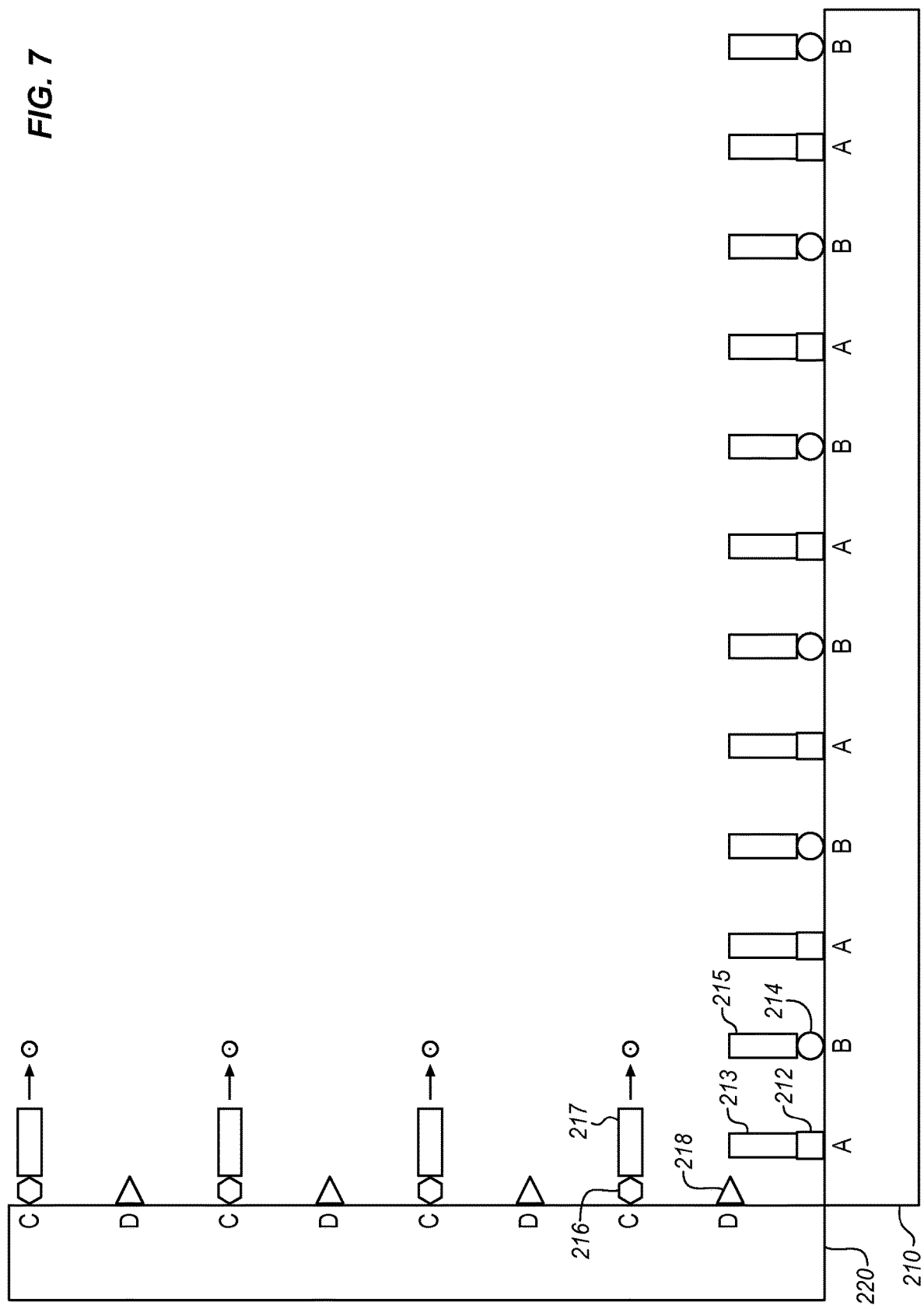
Figure 8:
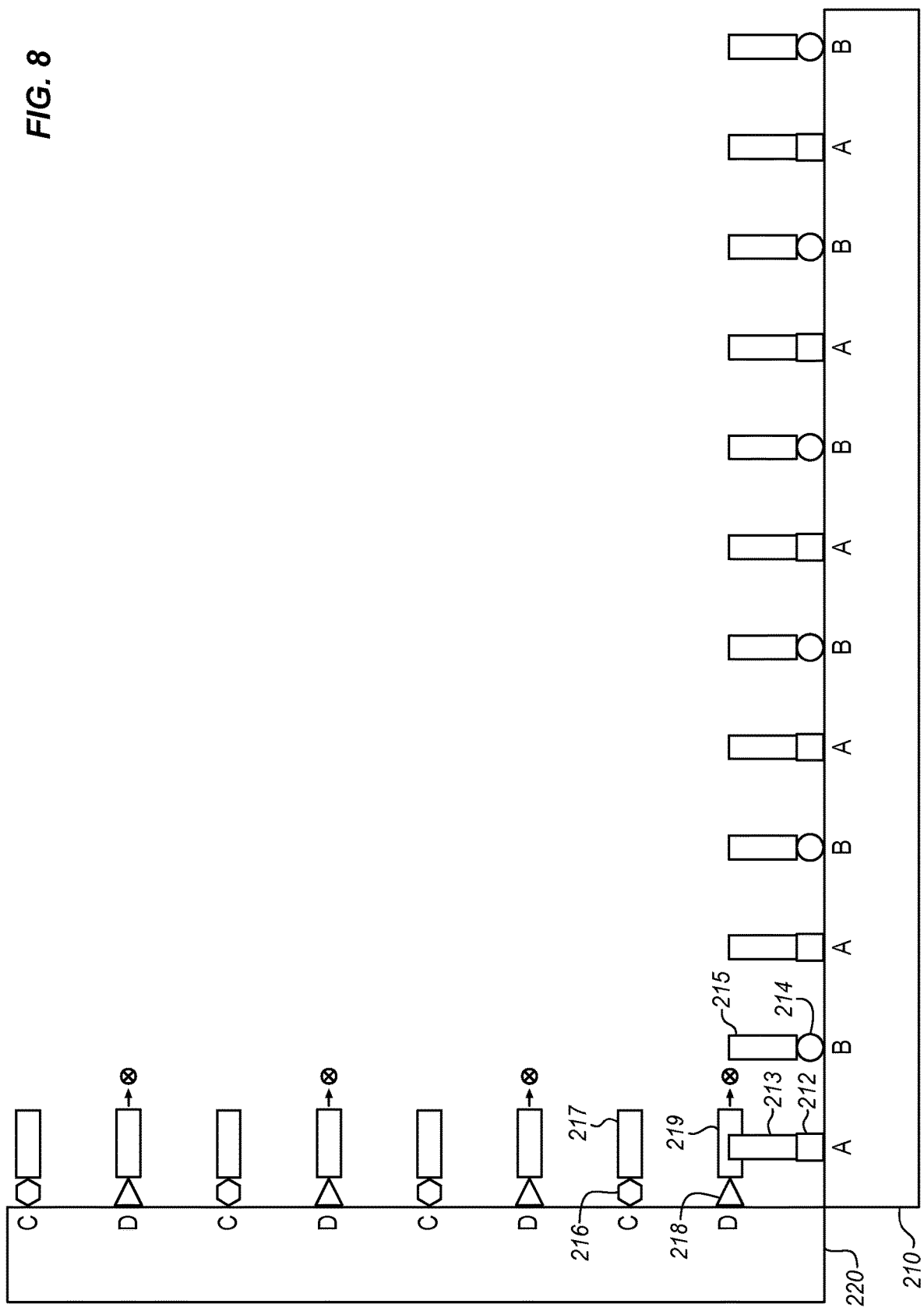
Figure 9:
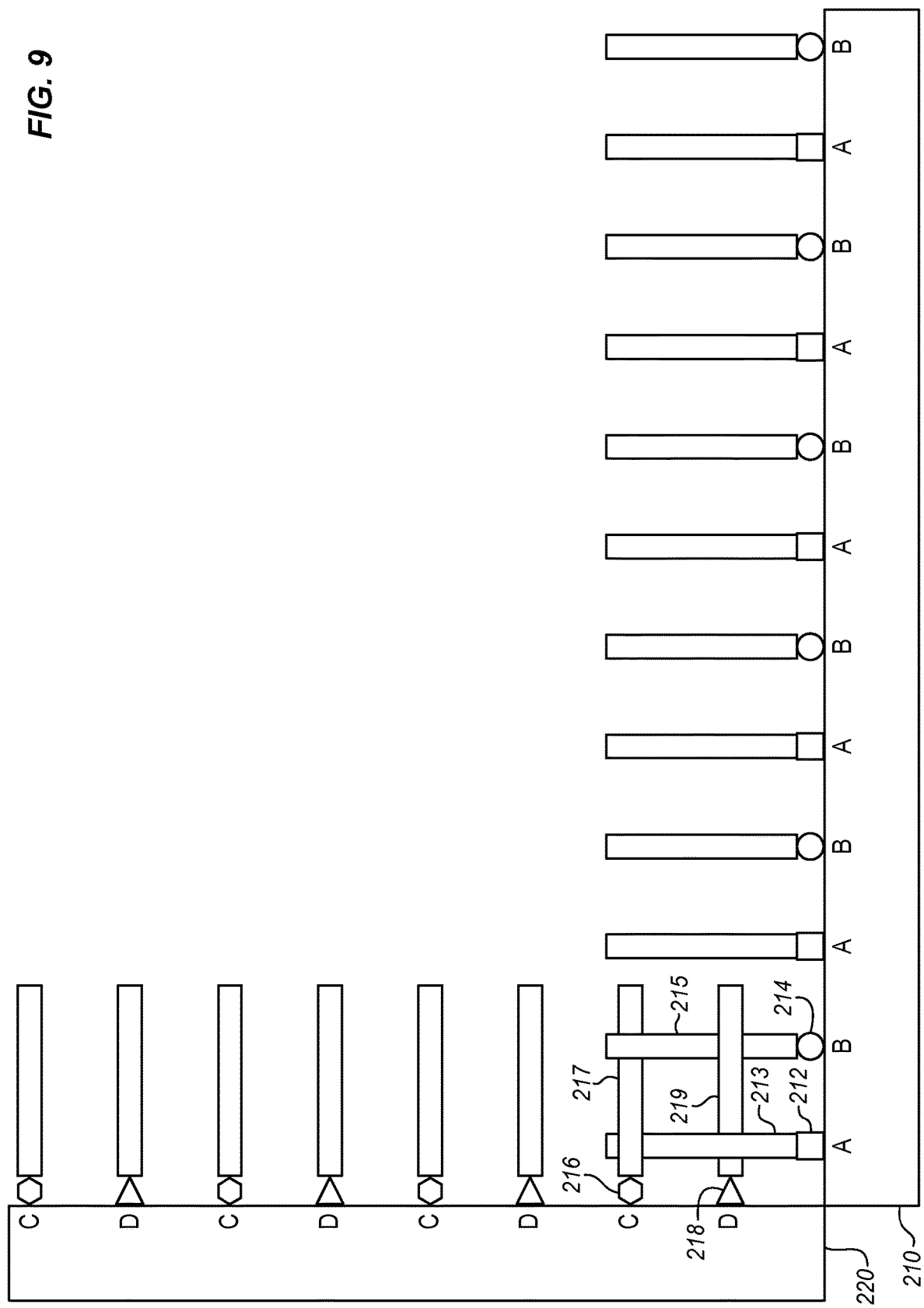

Controller 230 may continue to trigger growth for different sets of carbon nanotubes, and change their direction of growth, in order to trigger interweaving of the different sets of carbon nanotubes (step 310, returning to step 302). For example, as shown in FIG. 6, carbon nanotubes 215 (having chirality B) are grown from catalysts 214 upward and into the page away from the reader. Then carbon nanotubes 217 (having chirality C) are grown from catalysts 216 rightward and out of the page towards the reader as shown in FIG. 7, and carbon nanotubes 219 (having chirality D) are grown from catalysts 218 upward and out of the page towards the reader as shown in FIG. 8. Growth continues in this fashion in FIGS. 9 and 10, but the vertical component of growth for each set of nanotubes is periodically reversed/inverted/altered (e.g., in an oscillating fashion). This may be achieved by sweeping the electrical field back and forth through a repeating range of alignments. This results in layer 1000 exhibiting woven properties (because the nanotubes grow alternately upward and downward around each other as their growth continues).

Figure 10:
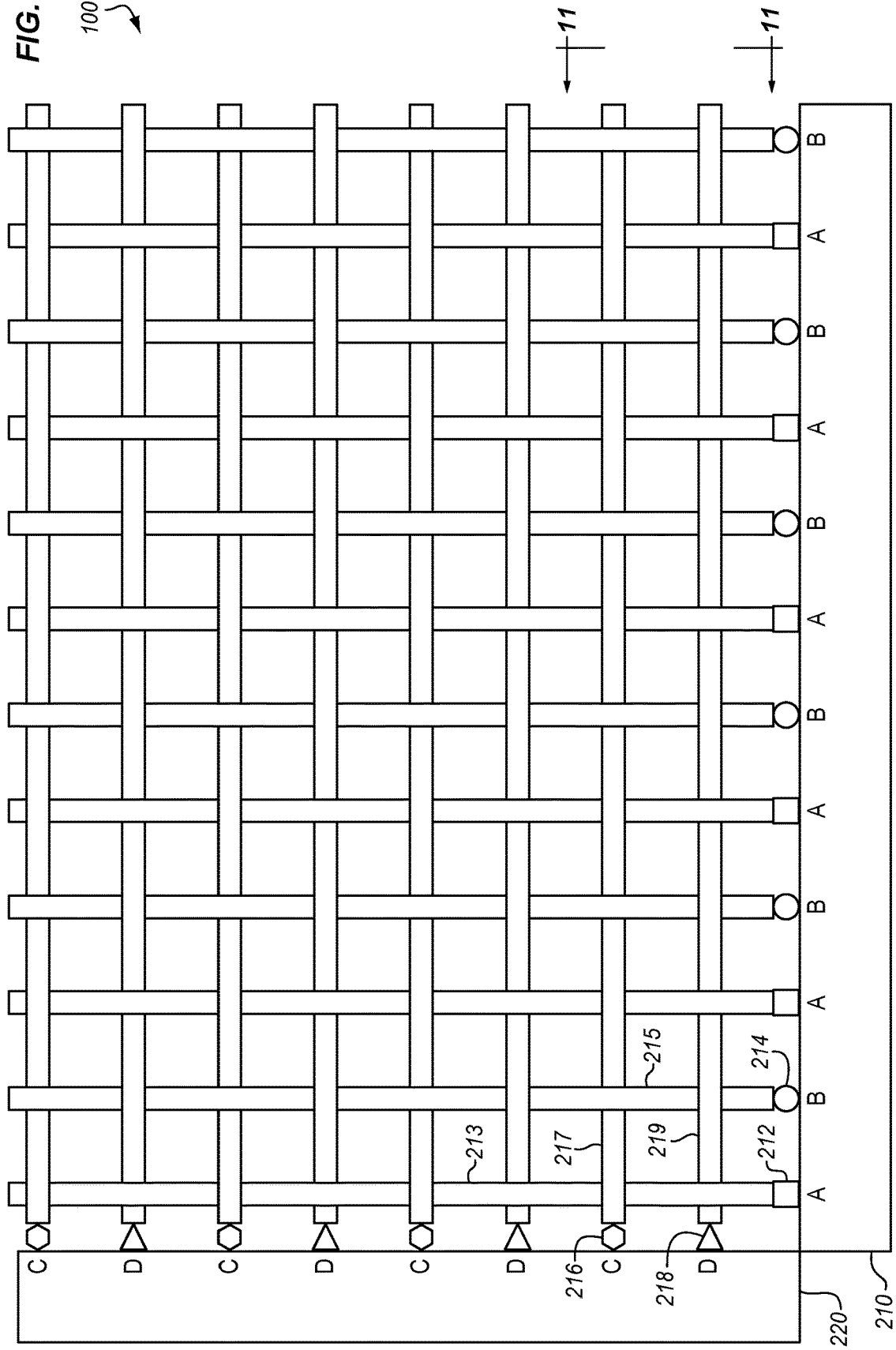
Figure 11:
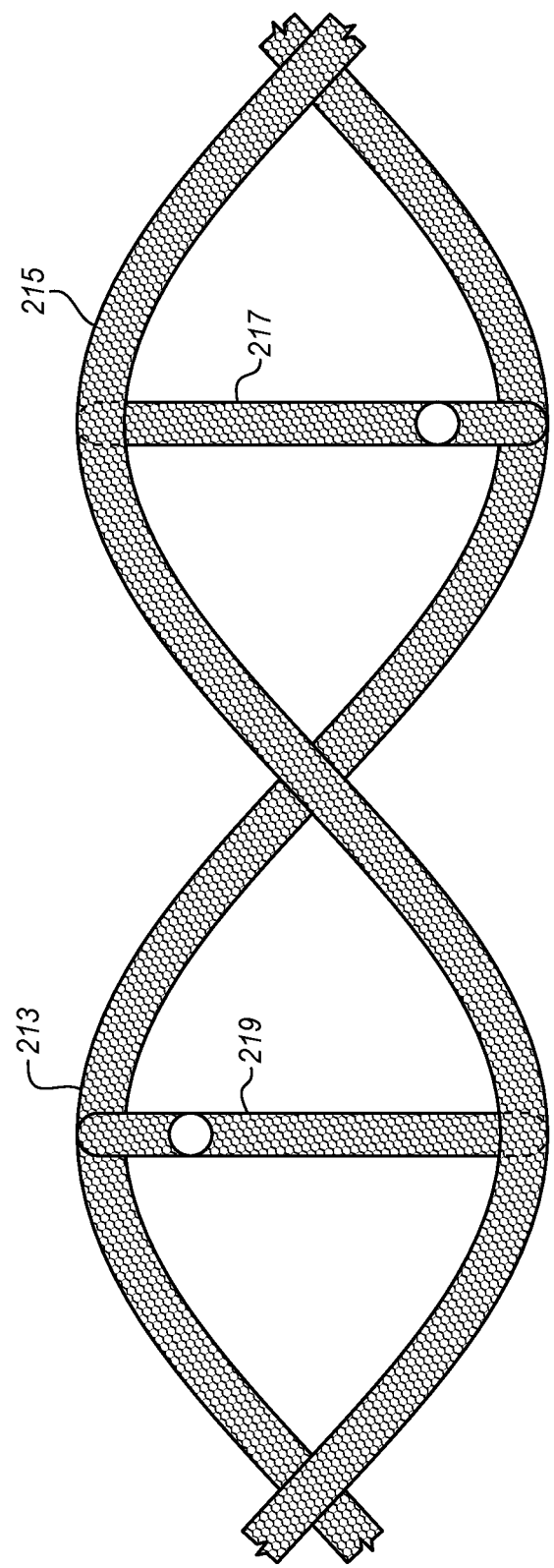
FIG. 11 is a diagram illustrating sinusoids formed by carbon nanotubes in an exemplary embodiment.

FIG. 11 is a side view of a portion of layer 1000 shown in FIG. 10. Specifically, FIG. 11 is illustrated by view arrows 11 of FIG. 10. In FIG. 11, the lattice structure of individual carbon nanotubes is shown merely for the purpose of illustration and is not to scale. FIG. 11 illustrates that carbon nanotubes 213 and 215 may be grown to form sinusoids that have the same amplitude and continue in the same direction, but are offset/shifted in phase from each other such that when carbon nanotube 213 reaches a peak, carbon nanotube 215 reaches a valley. Carbon nanotubes 217 and 219 also form sinusoids that are offset in phase, and travel in a direction that will cause them to interweave with nanotubes 213 and 215. In one embodiment, catalysts for carbon nanotubes that are placed on the same substrate are separated from each other by a distance of several millimeters. The carbon nanotubes in this embodiment may also oscillate upward and downward during growth by an amplitude of several millimeters. That is, the amplitude of the sinusoids shown in FIG. 11 may be several millimeters. While sinusoidal shapes are illustrated in FIG. 11, the techniques described herein are by no means limited to sinusoidal patterns nor to the length scales indicated.

Figure 12:
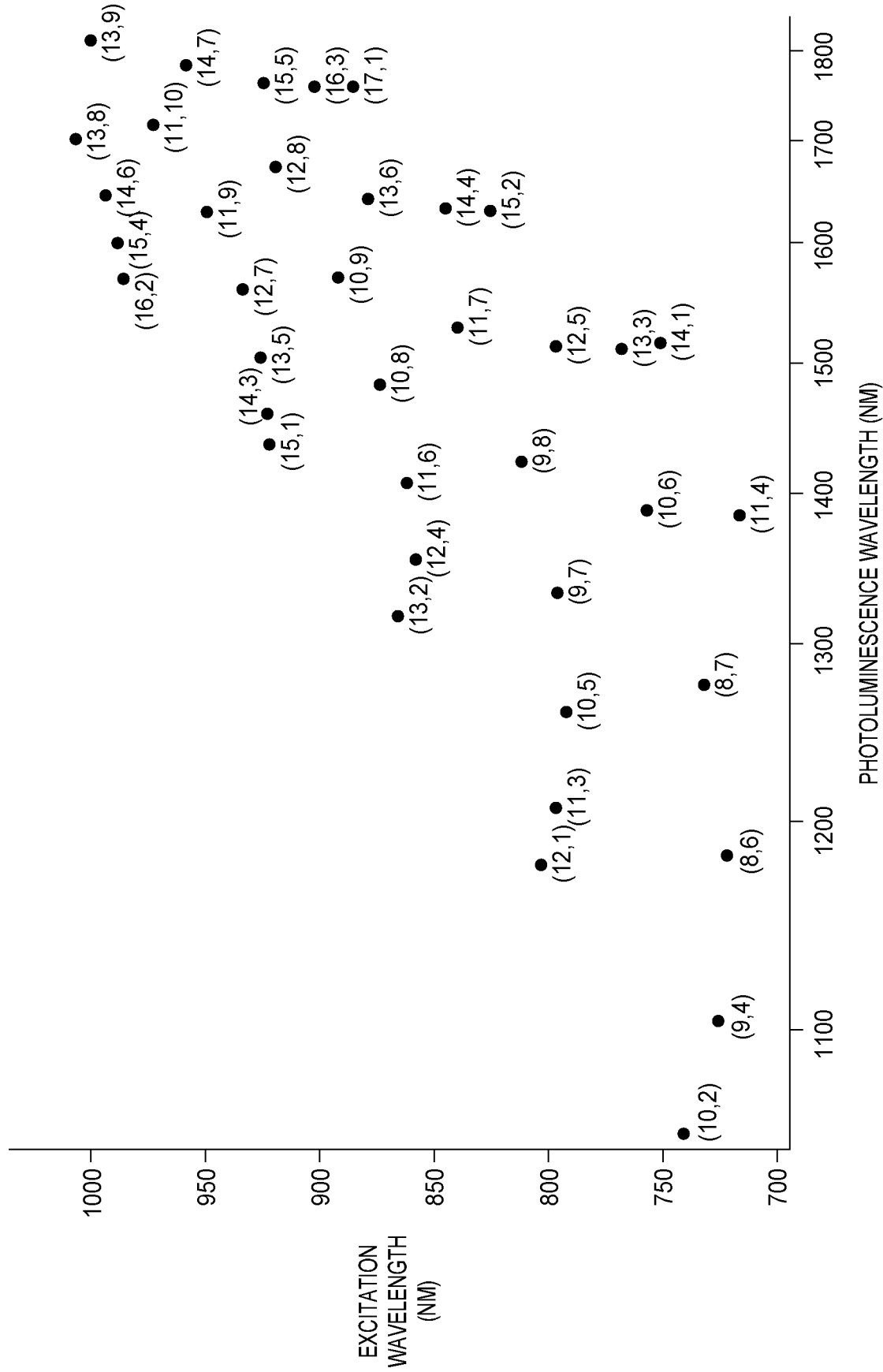
FIG. 12 is a diagram illustrating excitation wavelengths and photoluminescence wavelengths for different chiralities of carbon nanotubes in an exemplary embodiment.
Figure 13:
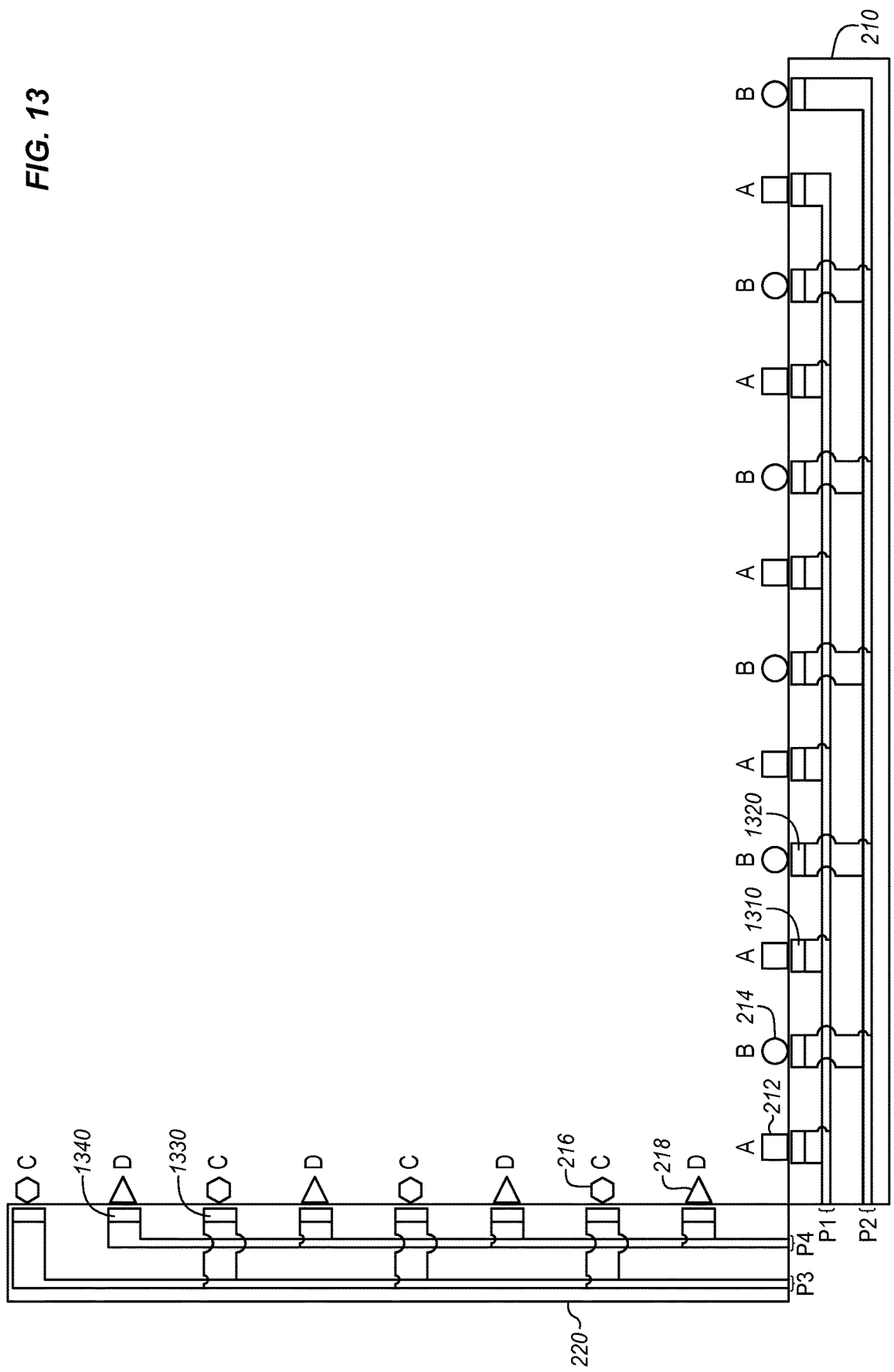
FIG. 13 is a diagram illustrating substrates that utilize heaters in an exemplary embodiment.

FIGS. 12-13 illustrate concepts and systems relating to selectively heating different sets and/or chiralities of nanotubes to facilitate the growth processes described above. Specifically, FIG. 12 is a diagram illustrating excitation wavelengths/frequencies and photoluminescence wavelengths/frequencies for different chiralities of carbon nanotubes in an exemplary embodiment. This information may be utilized to operate lighting system 232 of FIG. 2 to selectively heat (and thereby trigger the growth of) different chiralities of carbon nanotubes. Specifically, by emitting light at both the photoluminescence wavelength/frequency and the excitation wavelength/frequency of a specific chirality of nanotube, that chirality of nanotube may experience substantially more heating than other chiralities. Thus, by selectively operating lighting system 232 to apply multiple wavelengths of light at specific frequencies at the same time, controller 230 may selectively heat catalysts within fabrication system 200 to a temperature that triggers growth.

FIG. 13 is a diagram illustrating substrates that utilize heaters (1310, 1320, 1330, 1340) to heat carbon nanotubes in an exemplary embodiment. In this embodiment, different chiralities of carbon nanotubes need not be used. Instead, the heaters may be selectively activated by controller 230 to trigger the growth of different sets of carbon nanotubes. These heaters (1310, 1320, 1330, 1340) may be integrated into substrates (e.g., 210, 220) upon which the catalysts (e.g., 212, 214, 216, 218) are arranged. For example, as shown in FIG. 13, heaters 1310 (for catalysts 212) are electrically coupled to activate by applying a differential voltage to wires P1, while heaters 1320 (for catalysts 214) are electrically coupled to activate by applying a differential voltage to wires P2. In a similar fashion, heaters 1330 (for catalysts 216) are electrically coupled to activate by applying a differential voltage to wires P3, while heaters 1340 (for catalysts 218) are electrically coupled to activate by applying a differential voltage to wires P4.

The techniques described herein may also be applied in systems that allow for multiple layers of woven carbon nanotubes to be created at once. For example, FIGS. 14-15 are diagrams illustrating a substrate 1410 capable of growing multiple layers of carbon nanotubes at once in an exemplary embodiment. In FIG. 14, a top view is shown of substrate 1410. FIG. 15 illustrates a front view of substrate 1410 indicated by view arrows 15. As shown in FIG. 15, carbon nanotubes are grown from alternating locations A and B, in each of multiple layers 1510, 1520, and 1530. In this manner, fabrication may be performed efficiently as heating and electric fields may be applied to facilitate the growth of carbon nanotubes in multiple layers at once.

FIGS. 16-17 are diagrams illustrating motion of an electric field generator 1610 about substrates for growing carbon nanotubes in an exemplary embodiment. Specifically, FIG. 16 is a zoomed out view of FIG. 5, wherein substrates 210 and 220 are surrounded by a chassis, 1690 and FIG. 17 is a front view indicated by view arrows 17 of FIG. 16. According to FIGS. 16-17, multiple electric field generators 1610 are placed on a rocking chassis 1690. Generators 1610 are attached to chassis 1690 via support elements 1640. Chassis 1690 rotates about axis 1650 in an oscillating fashion as growth occurs, causing electric field 1620 to change its orientation. As electric field 1620 changes orientation (e.g., by plus or minus five degrees of rotation about axis 1650), carbon nanotubes grown at substrate 220 change their orientation as they extend outward, resulting in the formation of sinusoidal carbon nanotubes. Similar mechanisms and systems may be utilized to generate varying electric fields that facilitate the growth of carbon nanotubes at substrate 210.

The rotation of chassis 1690 may be driven by any suitable mechanism, including form example linear actuator 1670, attached to a support element 1640 via a securement point 1660.

EXAMPLES

Figure 18:
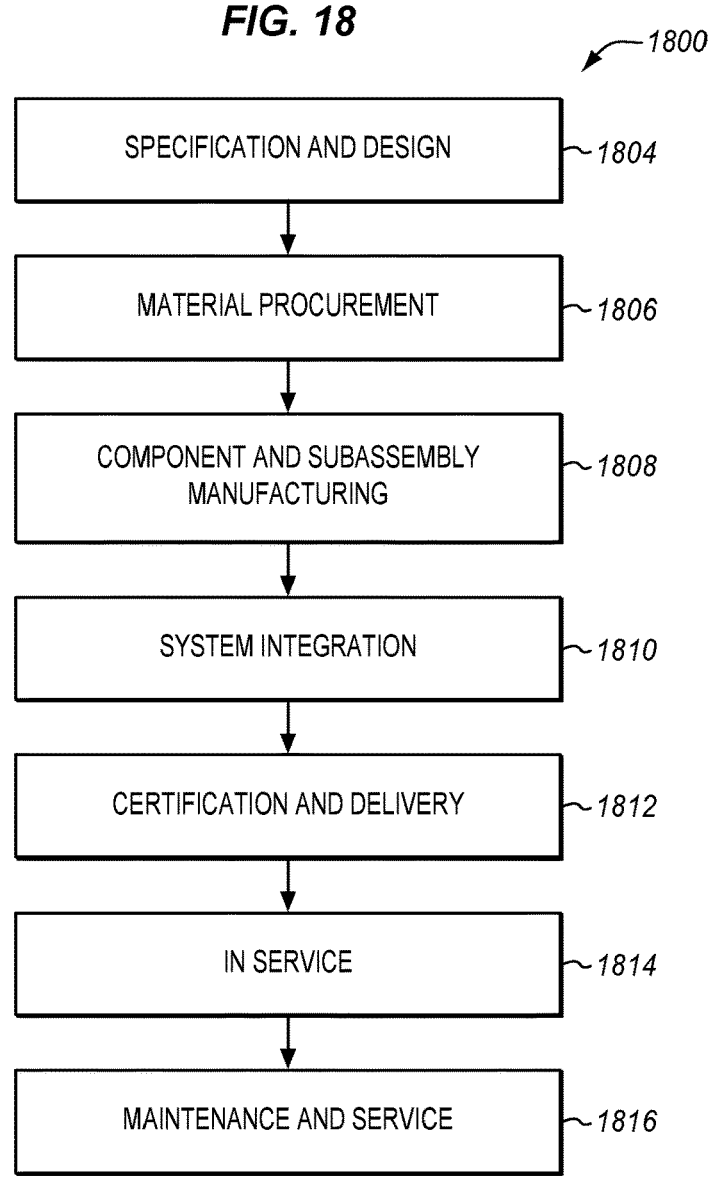
FIG. 18 is a flow diagram of aircraft production and service methodology in an exemplary embodiment.
Figure 19:
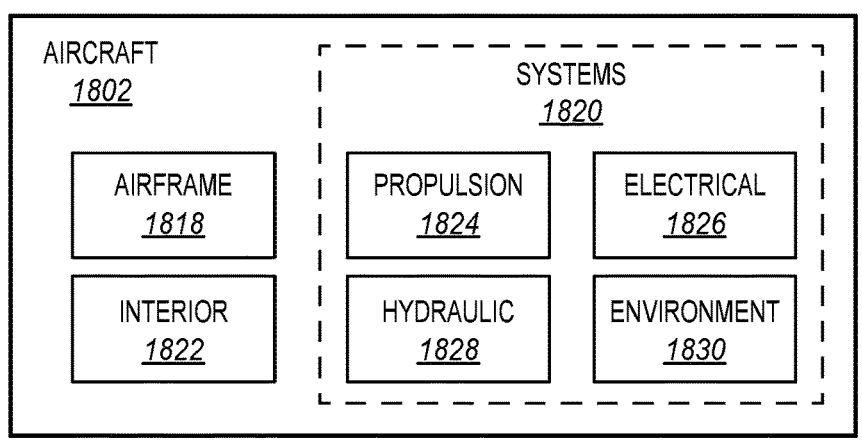
FIG. 19 is a block diagram of an aircraft in an exemplary embodiment.

Referring more particularly to the drawings, embodiments of the disclosure may be described in the context of an aircraft manufacturing and service method 1800 as shown in FIG. 18 and an aircraft 1802 as shown in FIG. 19. During pre-production, exemplary method 1800 may include specification and design 1804 of the aircraft 1802 and material procurement 1806. During production, component and subassembly manufacturing 1808 and system integration 1810 of the aircraft 1802 takes place. Thereafter, the aircraft 1802 may go through certification and delivery 1812 in order to be placed in service 1814. While in service by a customer, the aircraft 1802 is scheduled for routine maintenance and service 1816 (which may also include modification, reconfiguration, refurbishment, and so on).

Each of the processes of method 1800 may be performed or carried out by a system integrator, a third party, and/or an operator (e.g., a customer). For the purposes of this description, a system integrator may include without limitation any number of aircraft manufacturers and major-system subcontractors; a third party may include without limitation any number of vendors, subcontractors, and suppliers; and an operator may be an airline, leasing company, military entity, service organization, and so on.

As shown in FIG. 19, the aircraft 1802 produced by exemplary method 1800 may include an airframe 1818 with a plurality of systems 1820 and an interior 1822. Examples of high-level systems 1820 include one or more of a propulsion system 1824, an electrical system 1826, a hydraulic system 1828, and an environmental system 1830. Any number of other systems may be included. Although an aerospace example is shown, the principles of the invention may be applied to other industries, such as the automotive industry.

Apparatus and methods embodied herein may be employed during any one or more of the stages of the production and service method 1800. For example, components or subassemblies corresponding to production stage 1808 may be fabricated or manufactured in a manner similar to components or subassemblies produced while the aircraft 1802 is in service. Also, one or more apparatus embodiments, method embodiments, or a combination thereof may be utilized during the production stages 1808 and 1810, for example, by substantially expediting assembly of or reducing the cost of an aircraft 1802. Similarly, one or more of apparatus embodiments, method embodiments, or a combination thereof may be utilized while the aircraft 1802 is in service, for example and without limitation, to maintenance and service 1816. For example, the techniques and systems described herein may be used for steps 1806, 1808, 1810, 1814, and/or 1816, and/or may be used for airframe 1818 and/or interior 1822, or even any of propulsion 1824, electrical 1826, environmental 1830, hydraulic 1828, or systems 1820 in general.

In one embodiment, layer 100 of FIG. 1 comprises a portion of airframe 118 (e.g., a portion of a composite part utilized for a wing of an aircraft), and is manufactured during component and subassembly manufacturing 1808. Layer 100 may be assembled together with other layers into a composite part for an aircraft in system integration 1810, and then be utilized in service 1814 until wear renders the part unusable. Then, in maintenance and service 1816, the part may be discarded and replaced with a newly manufactured part including a new layer 100.

Any of the various control elements shown in the figures or described herein may be implemented as hardware, software, firmware, or some combination of these. For example, an element may be implemented as dedicated hardware. Dedicated hardware elements may be referred to as "processors", "controllers", or some similar terminology. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, a network processor, application specific integrated circuit (ASIC) or other circuitry, field programmable gate array (FPGA), read only memory (ROM) for storing software, random access memory (RAM), non-volatile storage, logic, or some other physical hardware component or module.

Also, an element may be implemented as instructions executable by a processor or a computer to perform the functions of the element. Some examples of instructions are software, program code, and firmware. The instructions are operational when executed by the processor to direct the processor to perform the functions of the element. The instructions may be stored on storage devices that are readable by the processor. Some examples of the storage devices are digital or solid-state memories, magnetic storage media such as a magnetic disks and magnetic tapes, hard drives, or optically readable digital data storage media.

Although specific embodiments are described herein, the scope of the disclosure is not limited to those specific embodiments. The scope of the disclosure is defined by the following claims and any equivalents thereof.

The invention claimed is:

1. A method comprising:
   selectively growing carbon nanotubes via a Chemical Vapor Deposition (CVD) process, comprising:
   aligning an electrical field in a first direction for a first set of carbon nanotubes;

heating the first set of carbon nanotubes above a threshold temperature to trigger parallel growth of the first set of carbon nanotubes in the first direction via CVD; and repeatedly varying the first direction by adjusting the electrical field, causing the first set of carbon nanotubes to interweave into a second set of carbon nanotubes in a repeating pattern as growth continues.

2. The method of claim 1 further comprising:
aligning the electrical field in a second direction for the second set of carbon nanotubes;
heating the second set of carbon nanotubes above the threshold temperature to trigger parallel growth of the second set of carbon nanotubes in the second direction via CVD; and
repeatedly varying the second direction by adjusting the electrical field, causing the second set of carbon nanotubes to interweave into the first set of carbon nanotubes as growth continues.

3. The method of claim 1 further comprising:
heating the first set of carbon nanotubes by increasing the temperature of heaters proximate to the first set of carbon nanotubes.

4. The method of claim 1 further comprising:
heating the first set of carbon nanotubes by:
identifying a photoluminescence frequency of light for the first set of carbon nanotubes;
identifying an excitation frequency of light for the first set of carbon nanotubes; and
applying light at both the excitation frequency and the photoluminescence frequency to the first set of carbon nanotubes.

5. The method of claim 1 wherein:
the first set of carbon nanotubes and the second set of carbon nanotubes are coplanar.

6. The method of claim 1 wherein:
repeatedly varying the first direction comprises iteratively adjusting the electrical field back and forth through a repeating range of alignments, causing the first set of carbon nanotubes to form a sinusoid during growth.

7. A system for fabricating a sheet of interwoven carbon nanotubes, the system comprising:
carbon nanotube catalysts that grow different sets of nanotubes;
a heating system configured to heat the nanotubes;
an electric field generator; and
a controller configured to operate the heating system to selectively heat individual sets in order to trigger carbon nanotube growth during Chemical Vapor Deposition (CVD), and to operate the electric field generator to generate an electrical field that points in a direction that varies during the growth of a set of carbon nanotubes, causing carbon nanotubes of the set to interweave other carbon nanotubes in a repeating pattern as growth continues.

8. The system of claim 7, wherein:
the heating system comprises a lighting system;
each set comprises a different chirality of nanotube; and
the controller is configured to operate the lighting system to selectively heat an individual chirality by:
identifying a photoluminescence frequency of light for the chirality;
identifying an excitation frequency of light for the chirality; and
generating light at both the excitation frequency and the photoluminescence frequency.

9. The system of claim 8 wherein:
the controller is configured to operate the lighting system by generating multiple frequencies of light at the same time.

10. The system of claim 7 wherein:
the catalysts are floating catalysts.

11. The system of claim 7 wherein:
the catalysts are fixed to a substrate.

12. The system of claim 7 wherein:
the heating system comprises heaters integrated into substrates upon which the catalysts are arranged.

13. The system of claim 12 wherein:
the controller is configured operate alternating heaters to cause alternating sets of carbon nanotubes to grow at once.

14. The system of claim 12 wherein:
the heaters for each set are electrically coupled with each other.

15. The system of claim 7 wherein:
the controller is configured to operate the electric field generator to cause the set of carbon nanotubes to grow into a sinusoid.

16. A material comprising:
a layer consisting essentially of continuous carbon nanotubes, comprising:
continuous carbon nanotubes oriented in a first direction; and
continuous carbon nanotubes oriented in a second direction that crosses the first direction, and that have grown in a repeatedly varying direction to be interwoven through the carbon nanotubes oriented in the first direction in a repeating pattern, wherein each of the continuous carbon nanotubes oriented in the first direction interweaves multiple continuous carbon nanotubes oriented in the second direction.

17. The material of claim 16 wherein:
the carbon nanotubes oriented in the second direction comprise:
carbon nanotubes that each form a first sinusoid; and
carbon nanotubes that each form a second sinusoid that is out of phase from the first sinusoid.

18. The material of claim 17 wherein:
the carbon nanotubes oriented in the first direction comprise a first chirality;
the carbon nanotubes forming the first sinusoid comprise a second chirality;
the carbon nanotubes forming the second sinusoid comprise a third chirality.

19. The material of claim 17 wherein:
each carbon nanotube forming the first sinusoid is adjacent to a carbon nanotube forming the second sinusoid.

20. The material of claim 16 wherein:
the carbon nanotubes in the layer undergo stress when forces are applied to the layer, and the mode of failure of the layer results from the carbon nanotubes in the layer breaking.

21. The material of claim 16 wherein:
the carbon nanotubes oriented in the first direction form a plain weave with the carbon nanotubes oriented in the second direction.

22. A material comprising:
a first set consisting essentially of continuous carbon nanotubes that comprise a first chirality and that are oriented in parallel;
a second set consisting essentially of continuous carbon nanotubes that comprise a second chirality and that form a first sinusoid intersecting the first set; and a third set consisting essentially of continuous carbon nanotubes that comprise a third chirality and that form a second sinusoid intersecting the first set, the second sinusoid is shifted in phase from the first sinusoid, and the first set and second set interweave the third set in a repeating pattern, wherein each of the continuous carbon nanotubes in the first set interweaves multiple continuous carbon nanotubes in the second set.

23. The material of claim 22 wherein:

the first sinusoid and the second sinusoid continue in the same direction.

24. The material of claim 22 wherein:

the first sinusoid and the second sinusoid have the same amplitude.

25. The material of claim 23 wherein:

the carbon nanotubes in the material undergo stress when forces are applied to the layer, and the mode of failure of the material results from the carbon nanotubes in the layer breaking.

\* \* \* \* \*